United States Patent [19]
Tustaniwskyj et al.

[11] Patent Number: 5,441,195
[45] Date of Patent: Aug. 15, 1995

[54] METHOD OF STRETCHING SOLDER JOINTS

[75] Inventors: Jerry I. Tustaniwskyj, Mission Viejo; Maria D. Alvarez, El Cajon; Steve J. Bezuk, Poway; Robert E. Rackerby, San Diego; Patrick A. Weber, Escondido, all of Calif.

[73] Assignee: Unisys Corporation, Blue Bell, Pa.

[21] Appl. No.: 181,282

[22] Filed: Jan. 13, 1994

[51] Int. Cl.⁶ .................. B23K 1/00; B23K 37/04
[52] U.S. Cl. ................. 228/180.22; 228/212; 228/254; 29/840
[58] Field of Search .......... 228/180.22, 254, 212, 228/49.5, 265; 29/840

[56] References Cited

U.S. PATENT DOCUMENTS

| | | | |
|---|---|---|---|
| 3,486,223 | 12/1969 | Butera | 29/840 |
| 3,921,285 | 11/1975 | Krall | 174/68.5 |

OTHER PUBLICATIONS

L. F. Miller, *IBM Tech. Discl. Bull.*, vol. 10, No. 11 (Apr. 1968) p. 1670.

J. M. Dalbo et al., *IBM Tech. Discl. Bull.*, vol. 27, No. 3 (Aug. 1984) p. 1579.

*IBM Tech. Discl. Bull.*, vol. 28, No. 10 (Mar. 1986) pp. 4337–4338.

*IBM Tech. Discl. Bull.*, vol. 29, No. 12 (May 1987) pp. 5213–5214.

*Primary Examiner*—Mark Rosenbaum
*Assistant Examiner*—Jeffrey T. Knapp
*Attorney, Agent, or Firm*—Charles J. Fassbender; Mark T. Starr

[57] ABSTRACT

A method of stretching solder joints between the input/output pads of an electrical component and corresponding input/output pads on a substrate includes the steps of: melting the solder joints; confining the component while the solder joints are melted such that the component can only move substantially perpendicular to the substrate; pulling the component, while the component is confined, by an external force in a direction away from the substrate to thereby stretch the melted solder joints; compelling the movement of the component to stop when the component has moved a predetermined distance; and, solidifying the solder joints while the component is compelled to stop. By stretching the solder joints with the above method, the solder joint shape can be changed from convex to concave; and thermally induced stress/strain in the joint is substantially reduced.

19 Claims, 5 Drawing Sheets

METHOD OF STRETCHING SOLDER JOINTS

BACKGROUND OF THE INVENTION

This invention relates to electromechanical assemblies of the type which include: a) an electrical component having a planar array of input/output pads, b) a substrate having a matching planar array of input/output pads, and c) respective solder joints that connect corresponding input/output pads of the electrical component and the substrate. More particularly, this invention relates to processes for stretching the solder joints in the above type of electromechanical assemblies in order to make the assemblies less susceptible to failure, due to the reduction of thermally induced stress and strain.

One specific example of the above type of assembly is where the electrical component is an integrated circuit die and the substrate is a cofired multi-layered ceramic substrate. To fabricate such an assembly, a respective "solder ball" is deposited on each of the input/output pads of the die. Typically, this is achieved by providing a mask which has an array of holes that only expose the die's input/output pads, and by vaporizing solder through the mask onto the input/output pads. Thereafter, the solder on the die is reflowed by a heating step, and then the die is placed on the substrate such that the die's solder balls are aligned with the substrate input/output pads. Then the solder balls are heated until they melt; and, lastly, the solder is cooled and resolidified to thereby form the solder joints between the aligned input/output pads.

During the above described prior art process, each of the solder joints is formed with a convex shape (i.e.—barrel shape). This shape occurs because when the solder balls are melted, the surface tension in each molten solder ball tends to minimize the solder ball's surface area; and for any given volume of molten solder, the minimum surface area is reached when the shape is spherical.

However, convex shaped solder joints have a major drawback when thermally induced stress and strain are considered. These stresses and strains arise when the die and the substrate are repeatedly heated and cooled during their operation. Due to that heating and cooling, the die and the substrate expand and contract; and if the die and the substrate have different thermal expansion coefficients, they will expand and contract by a different amount. In each solder joint, the average strain equals the difference by which the ends of the joint move divided by the height of the joint. Thus, as the joint shape bulges outward more, the joint height gets smaller for any given solder volume; and that decrease in joint height makes the strain larger. Likewise, the joint stress gets larger since it increases whenever strain increases.

A recent paper which discusses the above stress/strain problem is: "Mechanical Design Considerations For Area Array Solder Joints" by Peter Borgenson, Chi-Lu Li and H. D. Conway, IEEE Transactions on Components, Hybrids, and Manufacturing Technology, Volume 16, No. 3, May 1993 at pages 272-283. In that paper, the conventional convex shaped solder joint is shown in FIG. 4 on page 275.

Following FIG. 4, the paper goes through a mathematical analysis which shows that the stress in a mathematically modeled solder joint can be reduced if the joint length is somehow increased until the shape of the joint changes from convex to concave. Then, to actually build a real concave shaped solder joint, the paper on page 277 says: "In principal, different solder joint shapes may be achieved by two types of means. For one, we may, for example, vary either solder volume or pad size. Alternatively, we may somehow apply an additional downward or upward force during reflow".

However, in the remainder of the paper, the only actual method which is disclosed for fabricating a concave shaped solder joint is where the solder volume is varied; and that method is described in conjunction with FIG. 18. According to that disclosed method, solder balls are deposited on the die interior with a large volume of solder, and solder balls are deposited on the die periphery with a small volume of solder. Since the interior solder balls have a large volume of solder, those interior solder balls push the die farther away from the substrate than the periphery solder balls. Consequently, the solder balls on the periphery of the die get stretched and thereby achieve a concave shape.

But one major drawback with the above described method is that as the amount of solder in each interior solder ball increases, those solder balls become so large that the small periphery solder balls do not contact the input/output pads on the substrate when all of the solder balls are melted. Consequently, an additional undisclosed step would be required to somehow squeeze the large interior solder balls while they are molten until each small periphery solder ball contacts and forms a joint with the substrate input/output pads. Also, while the large molten interior solder balls are squeezed, a second additional undisclosed step would be required to somehow insure that the die does not tip and thereby cause any molten solder ball to be squeezed so much that it "squirts" off of it's input/output pad. Further, after the small molten solder balls on the die periphery have contacted the substrate input/output pads, a third undisclosed additional step would be required wherein the squeezing force is somehow removed so the small periphery solder balls get stretched.

Another drawback of the above described process is that as the amount of solder in each interior solder ball is increased, the cross-sectional area of that solder ball must likewise be increased. That is because when the solder ball is initially deposited on the input/output pad by vaporizing solder through a mask, it is impossible to exceed a certain height-to-width aspect ratio for the solder ball. Consequently, if it is desired to double the height of the interior solder balls, then the radius of those solder balls must also be approximately doubled. However, doubling the radius of the internal solder balls means that their cross-sectional area will be increased approximately by a factor of four; and thus the density with which an array of those solder balls can be formed will be decreased by approximately a factor of four. This is a serious problem because it limits the number of input/output signals that can be sent to/received from a die of any given size.

Accordingly, a primary object of the invention is to provide an improved method of elongating the solder joints in an electromechanical assembly wherein the above problems are overcome.

BRIEF SUMMARY OF THE INVENTION

In one particular implementation of the present invention, the solder joints between the input/output pads of an integrated circuit die and corresponding input- /output pads on a substrate are stretched by the steps of: a) melting the solder joints; b) surrounding the die with a fixture while the solder joints are melted such that the die can not rotate and can not move laterally, but can move substantially perpendicular to the substrate by just a predetermined distance; c) subjecting the die to a vacuum, while the die is confined by the fixture, such that the die moves inside the fixture by the predetermined distance and then hits the fixture and stops; and d) resolidifying the solder joints while the die is held by the vacuum against the fixture.

Alternatively, in a second implementation, the moving and stopping steps are achieved by a mechanical apparatus. This apparatus has a set of arms that grasp the die by its sides and then move the die perpendicular to the substrate by the predetermined distance. While the arms move, a fixture prevents rotational and lateral movement of the die.

With both of the above process implementations, the solder joints that are stretched can be disposed on the integrated circuit die in a high density array since none of the solder joints at the center of the array need to have a large volume. Also, both of the above process implementations use fewer steps than the Borgenson-Li-Conway variable solder process, and thus they are better suited for mass producing products at cost competitive prices.

DETAILED DESCRIPTION

Figure 1:
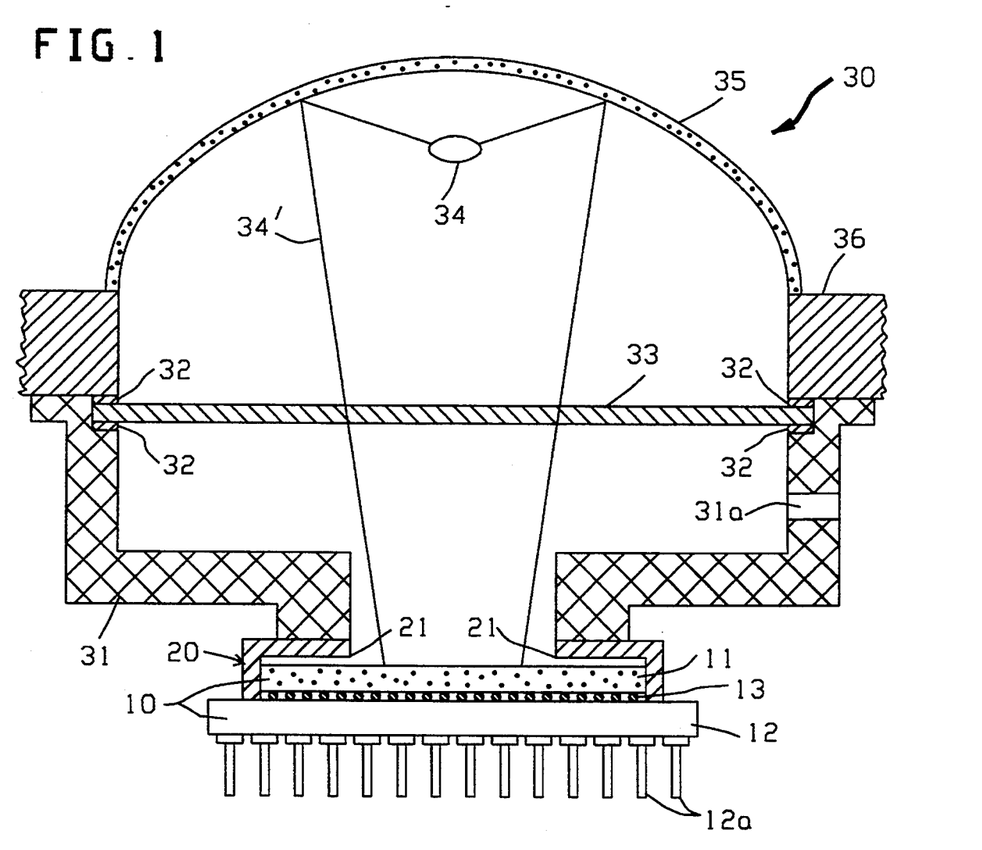
FIG. 1 is a cross-sectional view of a fixture and an apparatus which are positioned on an electromechanical assembly and which operate to stretch solder joints in that assembly in accordance with the present invention.

Referring now to FIG. 1, it shows an electromechanical assembly 10 which is about to be processed in accordance with the present invention. That assembly 10 includes an integrated circuit die 11 and a substrate 12 which are attached to each other by a set of solder joints 13.

In the FIG. 1 assembly 10, the die 11 and the substrate 12 and the solder joints 13 are conventional in structure. Thus, the die 11 can contain any type of circuitry such as CMOS circuitry and/or bipolar circuitry. Likewise, the substrate 12 can be any type of substrate such as a multi-layer ceramic substrate or a multi-layer epoxy glass substrate.

Electrical signals, including power and ground, travel between the die 11 and the substrate 12 through the solder joints 13. These signals are routed within the substrate 12 by conventional microscopic conductors (not shown) to the substrates input/output pins 12a.

Each solder joint 13 extends from a microscopic input/output pad on the die 10 to a corresponding input/output pad on the substrate 12. These pads are too small to be shown in FIG. 1; but they too are conventional in structure. Suitably, each input/output pad is simply a circular or approximately circular node on a patterned metal line of about 150 um diameter.

Initially, each solder joint 13 has a conventional height of about 125 um; and it has a conventional convex shape. But, by the process of the present invention, the height of each solder joint will be increased by 25% to 150%, and at an increase of about 40% its shape will be changed from convex to concave.

In FIG. 1, the process of elongating the solder joints 13 is carried out by a fixture 20 and a die moving apparatus 30. All the component parts of the die moving apparatus 30 are identified below in Table 1.

TABLE 1

Item 31 . . . a vacuum head
Item 32 . . . gaskets
Item 33 . . . a quartz disk
Item 34 . . . an infrared lamp
Item 35 . . . a parabolic reflector
Item 36 . . . a bracket In operation, the fixture 20 is placed over and around the chip 11 as shown in FIG. 1. Then, the die moving apparatus 30 is placed on top of the fixture 20 as is also shown in FIG. 1. Thereafter, the infrared lamp 34 is turned-on; and as a result, infrared radiation 34' is directed by the parabolic reflector 35 through the quartz disk 33 onto the integrated circuit die 11. Thus the integrated circuit die heats up which in turn causes the solder joints 13 to melt.

While the solder joints are melted, a vacuum 37 is applied to a port 31a in the vacuum head 31; and that vacuum causes the integrated circuit die 11 to move in the fixture 20 away from the substrate 12. Due to this movement, the solder joints 13 are stretched; and the stretching continues until the integrated circuit die 11 hits the top section 21 of the fixture 20. This is shown in FIG. 2. wherein the stretched solder joints are identified by reference numeral 13'.

Figure 2:
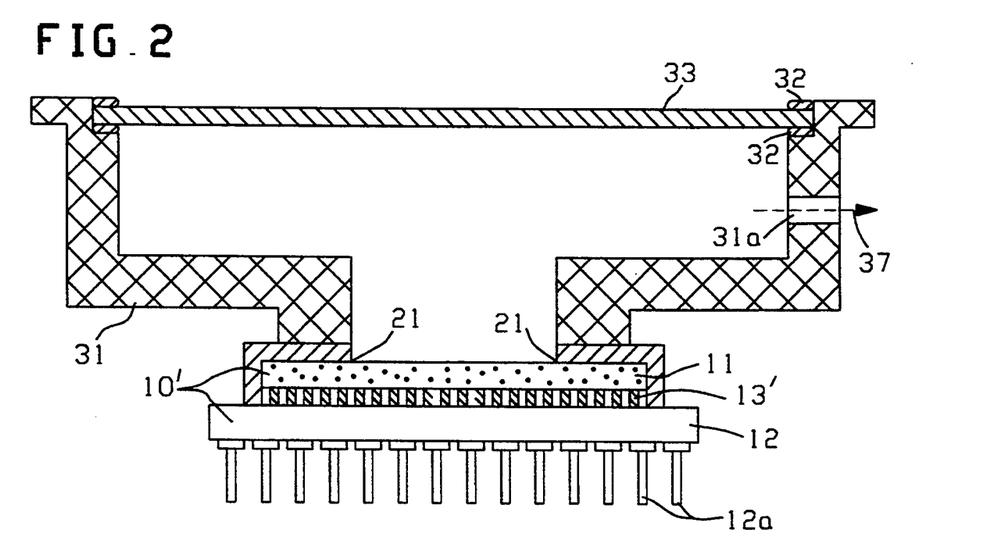
FIG. 2 shows the electromechanical assembly of FIG. 1, together with the fixture and the bottom portion of the FIG. 1 apparatus, after the solder joints have been stretched.

As the integrated circuit die 11 is held by the vacuum 37 in its FIG. 2 position, the infrared lamp 34 is turned-off. Consequently, the stretched solder joints 13' cool and resolidify. Then, the process is completed by removing the vacuum from the port 31a, moving the assembly 30 off of the fixture 20, and removing the fixture 20 from the integrated circuit die 11.

A critical point about the above described process is that as the FIG. 1 solder joints 13 are stretched to the FIG. 2 solder joints 13', the force which those solder joints exert upon the die 11 to oppose the vacuum first increases and then decreases. Consequently, if the movement of the chip 11 was not stopped by the top section 21 of the fixture 20, the vacuum would pull the die 11 away from the substrate 12 until all of the solder joints break. This point is evident from FIGS. 3 and 4.

Figure 3:
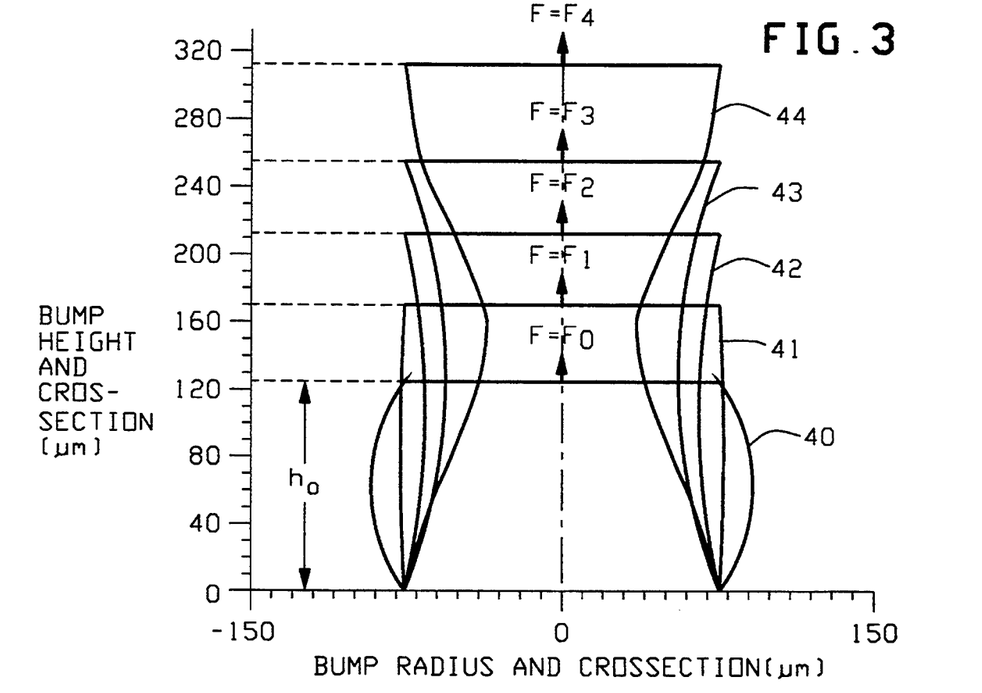
FIG. 3 is a set of curves, generated by a computer analysis, which illustrate how the shape of each solder joint changes as it is stretched by the fixture and apparatus of FIGS. 1 and 2.

In FIG. 3, reference numeral 40 shows the initial cross-sectional shape of a single solder joint 13 within the assembly 10 of FIG. 1. That initial shape 40 occurs when no vacuum force ($F = F_0 =$ zero) is being applied to the melted solder joint.

By comparison, reference numerals 41–44 show how the cross-sectional shape of the melted solder joint +14 changes as a non-zero vacuum force is applied to the joint. Shape 41 occurs when a force $F = F_1$ is applied to/resisted by the joint; shape 42 occurs when a force $F = F_2$ is applied to/resisted by the joint; etc.

Figure 4:
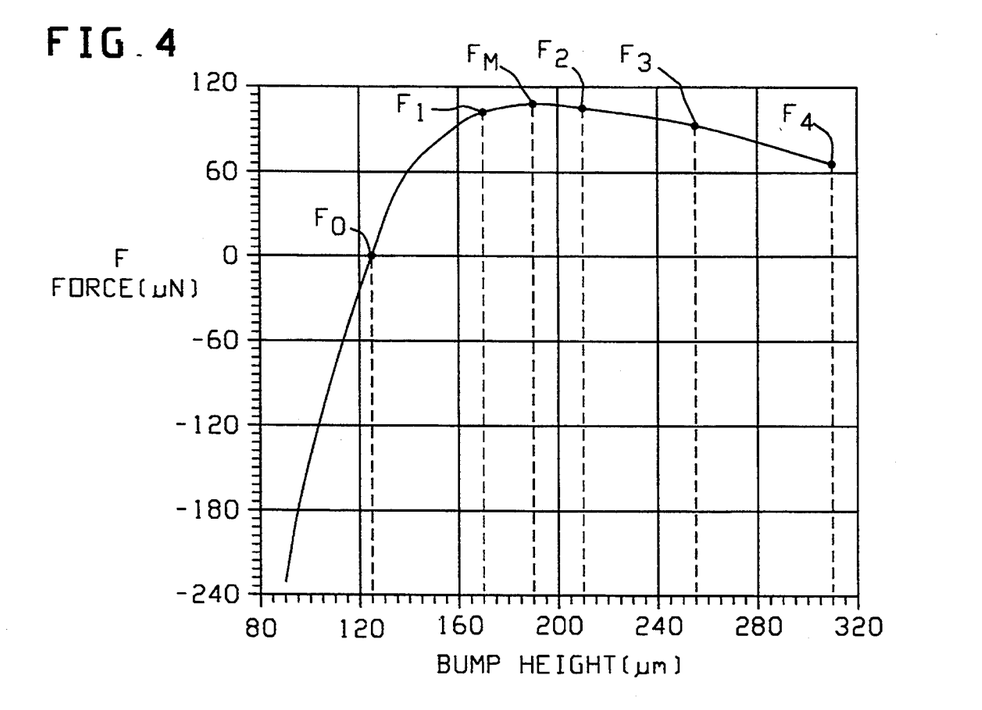
FIG. 4 is a computer generated curve which shows the amount of force that is applied to each solder joint in order to achieve the various solder joint shapes of FIG. 3.

Inspection of FIG. 4 shows that each solder joint initially resists the vacuum with an increasing amount of force until a certain maximum force $F_M$ is reached. This maximum resisting force $F_M$ occurs when the melted solder joint has a cylindrical shape with an approximately uniform radius.

Thereafter, when the melted solder joint takes on a concave shape, the amount of force which the joint can resist decreases as the joint stretches longer. Consequently, the concave shapes cannot be achieved by simply pulling on the die with a fixed predetermined force.

Further, in a mass production environment, the initial convex shape 40 can not even be stretched to the convex shape 41 by simply pulling on the die with a fixed predetermined force. That is because the amount of solder in each joint will have a certain tolerance. Thus, the zero force height $h_0$ of each joint will vary; and FIG. 4 shows that a slight increase in the force $F_1$ will make it equal or exceed the maximum force $F_M$. Consequently, an applied force $F = F_1$ will cause the small volume solder joints to stretch until they break.

Likewise, in a mass production environment, the accuracy with which the force $F_M$ can be externally applied to each solder joint will have a certain tolerance. Consequently, since the difference between the FIG. 4 force $F_1$ and the maximum force $F_M$ is so small (micro Newtons), any practical tolerance added to the force $F_1$ will cause the resultant force to exceed $F_M$.

Figure 5:
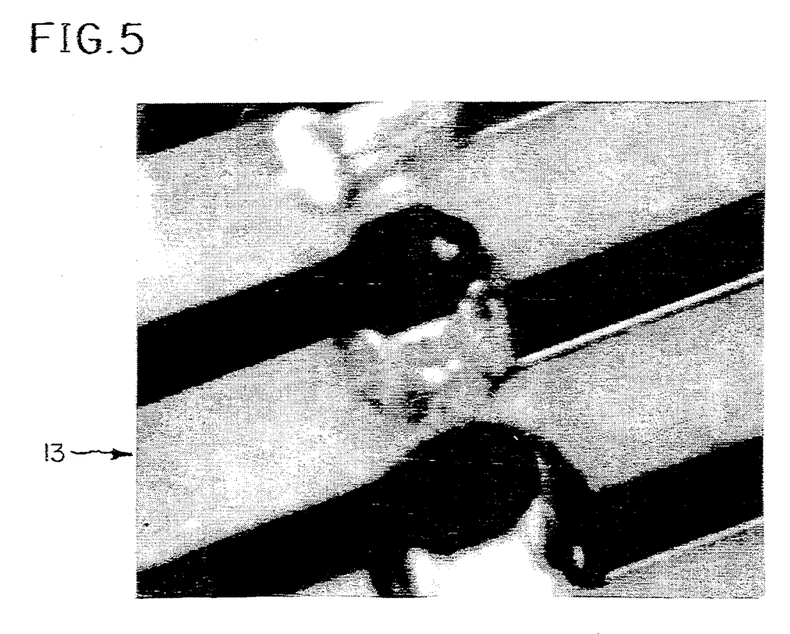
FIG. 5 is a microphotograph which shows the shape of an actual solder joint in the electromechanical assembly of FIG. 1 before it was stretched.
Figure 6:
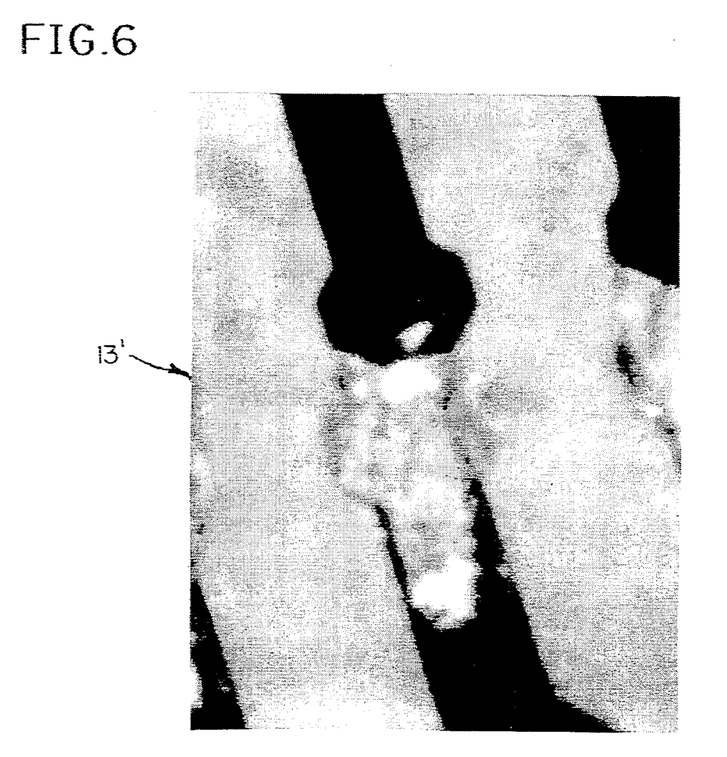
FIG. 6 is a microphotograph of the same solder joint as shown in FIG. 5 after it was stretched by the fixture and apparatus of FIGS. 1 and 2.

Turning now to FIGS. 5 and 6, they are microphotographs which verify the above described process. Specifically, FIG. 5 shows a convex shaped solder joint 13 as it occurs in the FIG. 1 assembly 10; and FIG. 6 shows the same solder joint after it was stretched by the process FIGS. 1 and 2. A comparison of the FIG. 5 solder joint to the FIG. 6 solder joint clearly shows that its shape has been changed from convex to concave. In FIG. 5 the height of the solder joint is three mils whereas in FIG. 6 the height of the solder joint is 7 mils. Magnification in FIGS. 5 and 6 is X400.

To enable the microphotographs of FIGS. 5 and 6 to be taken, the die 11 in the assembly 10 was replaced with a transparent piece of quartz which has the exact same shape and exact same input/output pads as the die 11. That permitted the microphotographs to be taken through the transparent quartz. If an actual die was used, that die would have to be removed to obtain FIG. 6; and removal of the die could distort the stretched solder joints 13'. However, the quartz did introduce glare into the photo's, and this is seen, for example, in FIG. 6. There, the bright area on the conductor next to the bottom of the solder joint is simply glare.

Next, with reference to FIGS. 7 and 8, additional structural details of the fixture 20 will be described. As those figures show, the fixture 20 has a thin flat top section 21 with a square perimeter. Also the fixture has four legs 22a–22d that respectively extend from the four sides of the top section 21. Further, the top section 21 of the fixture has an aperture 23 which enables the infrared radiation 34' to pass through the fixture and melt the solder joints. Suitably, the fixture 20 is made of metal or ceramic or plastic.

Each of the legs 22a–22d extends a distance "D" from the top section 21; and that distance determines the amount "S" by which tile solder joints 13 will be stretched. In particular, "D" equals die thickness plus initial solder joint height plus "S". For example, suppose that the integrated circuit die 11 in FIG. 1 is 500 microns thick and the solder joints 13 are 125 microns high. In that case, the distance "D" for each of the legs will be precisely machined to 625+S microns.

Figure 7:
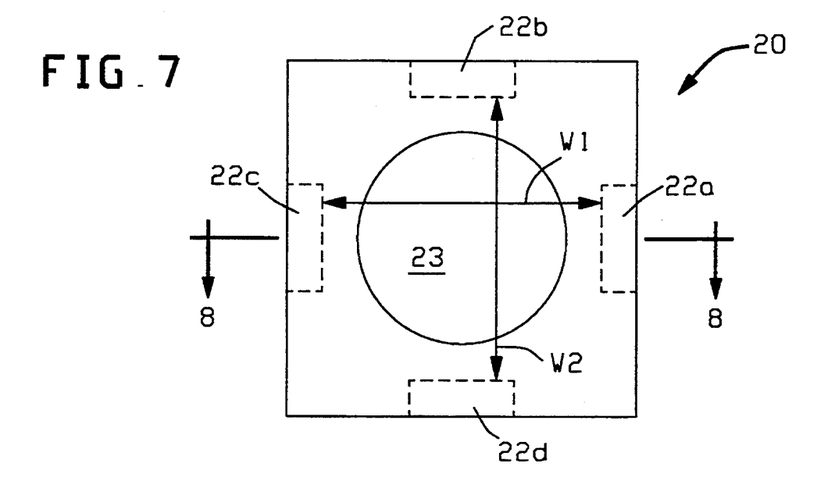
FIG. 7 is a top view of the fixture in FIGS. 1 and 2 which shows additional details of that fixture.
Figure 8:
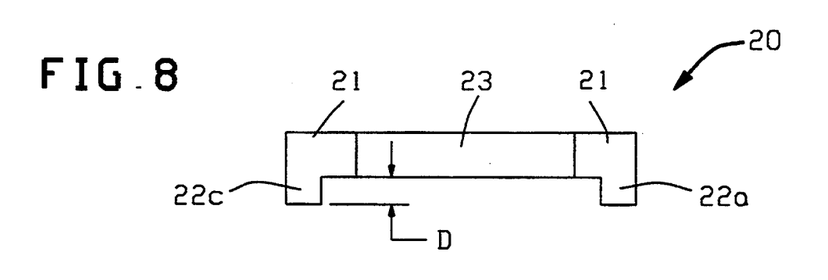
FIG. 8 is a sectional view of the fixture of FIG. 7 taken along lines 8—8.

Also in the fixture 20 of FIGS. 7 and 8, the legs 22a and 22c, and the legs 22b and 22d, are spaced apart by respective distances W1 and W2 which are just slightly larger than the integrated circuit die 13. As a result, the legs prevent the die from rotating and/or moving laterally as it is moved by the vacuum against the top section 21.

Figure 9:
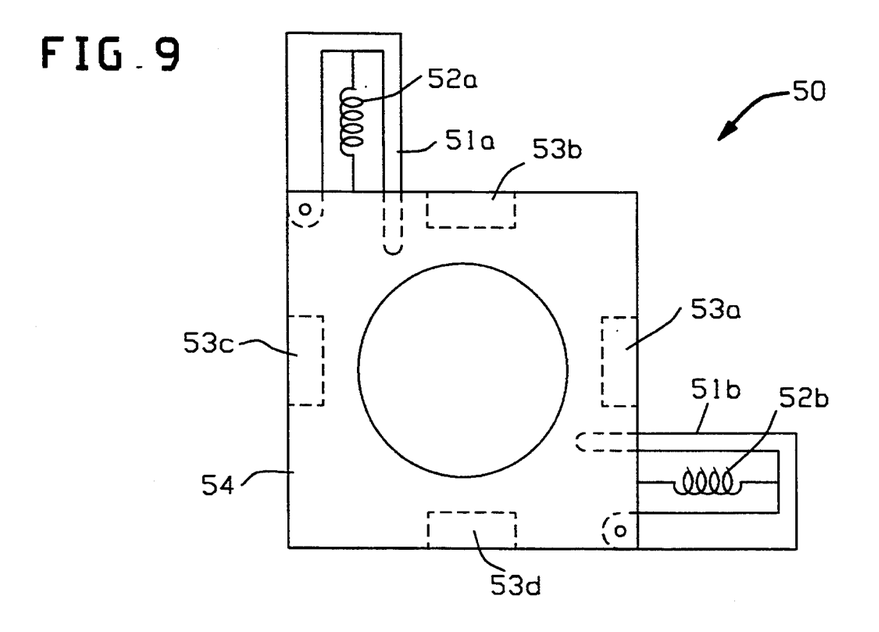
FIG. 9 is a top view of another fixture which can be used as an alternative to the fixture of FIGS. 7 and 8.

Next, referring to FIG. 9, it shows another fixture 50 which can be used in place of the above described fixture 20 in the process of FIGS. 1 and 2. Using this fixture 50, square die having a range of different widths as well as rectangular die having a range of different lengths and widths can be held in place while the process of FIGS. 1 and 2 is carried out. Likewise, the fixture 40 accommodates die length and width tolerances.

To hold these various shaped die, the fixture 50 has two movable arms 51a and 51b; and those arms are respectively forced against the die as shown by respective springs 52a and 52b. Also, the fixture 50 has four legs 53a–53d which extend from a top section 54 by the distance D which sets the amount S by which the solder joints on the die are stretched, just like the legs 22a–22d in the fixture 20.

Figure 10:
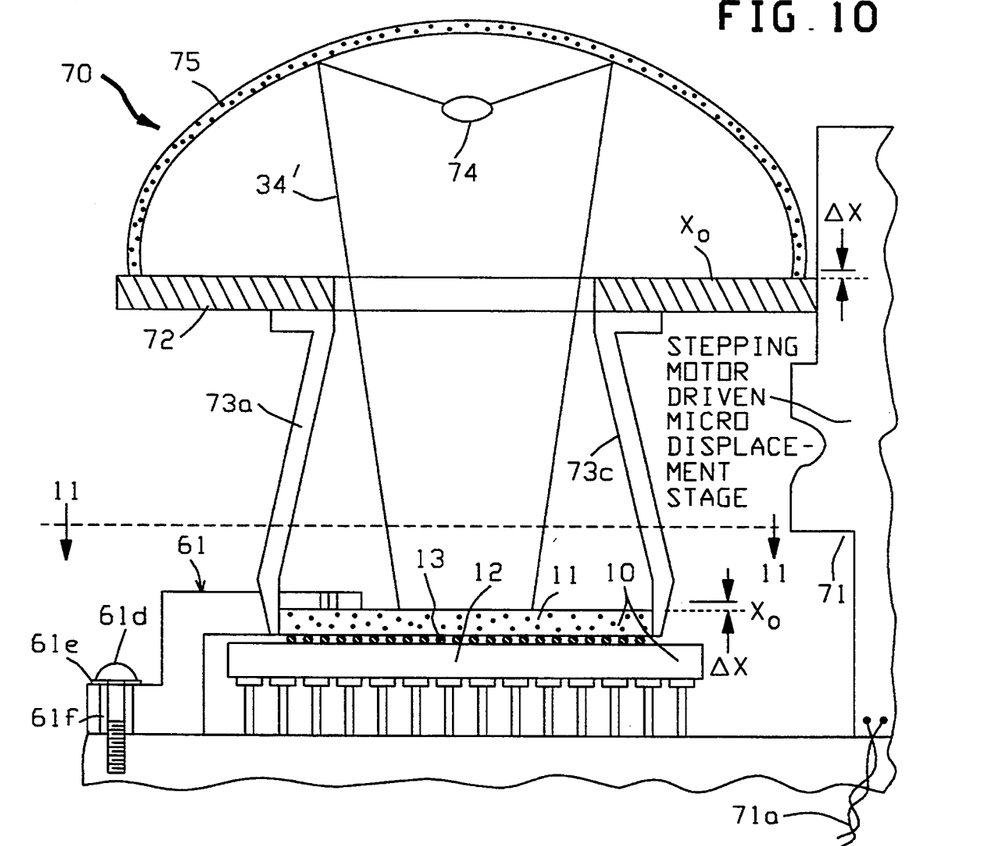
FIG. 10 is a cross-sectional side view, taken along section lines 10—10 in FIG. 11, of still another fixture and apparatus which can be used in place of the fixture and apparatus of FIGS. 1 and 2 to stretch solder joints in accordance with the present invention.
Figure 11:
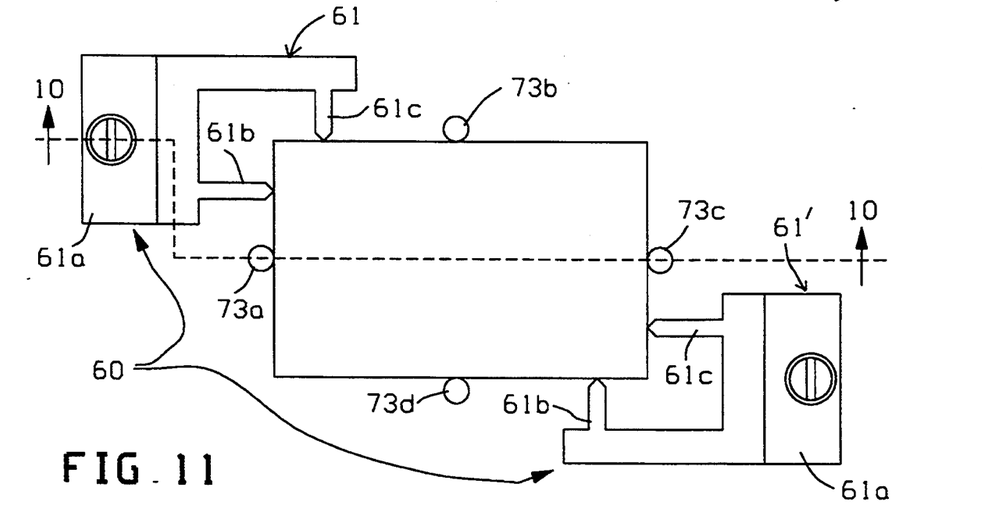
FIG. 11 is a sectional top view of the FIG. 10 fixture and apparatus, takes along section lines 11-11 in FIG. 10.

Next, referring to FIGS. 10 and 11, they show still another fixture 60 and another die moving apparatus 70 which together operate to stretch the solder joints 13 in the electromechanical assembly 10. As those figures show, the fixture 60 is comprised of two identical clamps 61 and 61'. Each clamp has a base 61a and a pair of guides 61b and 61c. To hold the base 61a in place, a screw 61d is provided which passes through a washer 61e and a hole 61f in the base and into an underlying table. Hole 61f is about twice as wide as the diameter of the screw 61d to allow the base to be moved such that the guides just barely touch the die. When the guides are in that position, the screw 61d is tightened. Also as shown in FIGS. 10 and 11, the die moving apparatus 70 includes the following items: a stepping motor driven micro displacement stage 71, a bracket 72 which is moved in increments $\Delta x$ by the stepping motor in stage 71, a set of four springy arms 73a–73d which extend in a cantilevered fashion away from the bracket 72, an infrared lamp 74, and a parabolic reflector 75. All of these items are interconnected as shown in FIG. 10.

In operation, the clamps 61 and 61' are positioned such that the guides 61b and 61c just barely touch the sides on two diagonally facing corners of the die. In that position, the guides prevent lateral and rotational movement of the die; but they permit the die to move in the vertical direction.

Next, the four springy arms 73a–73d are positioned as shown in FIGS. 10 and 11 such that they hold the die 11 by its four sides. In the illustrated position, two of the arms 73a and 73c operate as one pair of springs which push towards each other; and the other two arms 73b and 73d operate as another pair of springs which push towards each other.

Thereafter the infrared lamp 74 is turned on to thereby melt the solder joints 13. As those solder joints melt, the die 11 remains stationary because any vertical and rotational movement is prevented by the guides 61a and 61b, and any vertical movement is prevented by the four springy arms 73a–73d.

While the solder joints 13 are completely melted, those solder joints are stretched by sending electrical signals to the stepping motor in stage 71 via conductors 71a which cause the bracket 72 to move a predetermined number "N" of increments "$\Delta X$". Each time the bracket 72 moves by one of the $\Delta x$ increments, the solder joints 13 get stretched by the same amount; and thus the total amount by which the solder joints get stretched is $S=(N)(\Delta X)$.

A primary feature of the above described process is that it precisely controls the distance by which the solder joints 13 are stretched, even when the electromechanical assembly 10 has several dimensional tolerances. Such tolerances include a thickness variation on the die 11, a flatness variation on the substrate 12, and a volume variation in each solder joint. This feature is achieved because the springy arms 73a–73d hold the integrated circuit die by its sides. Thus, even though the initial height $x_0$ of the die 11 varies relative to the substrate, and the stretching increments $\Delta x$ will always be referenced to that initial height.

After the solder joints 13 have been stretched by the desired number of $\Delta x$ increments, the infrared lamp 74 is turned off. Then the solder joints are allowed to resolidify, and the stretching operation is complete.

Several preferred methods for stretching solder joints in electromechanical assembly in accordance with the present invention have now been described in detail. In addition however, various changes and modifications can be made to those details without departing from the nature and spirit of the invention.

For example, when the present invention is used, the solder joints which are stretched may be composed of any type of solder. Thus, the solder can have any predetermined chemical composition; and it can have any predetermined melting temperature.

Likewise, in the above described processes, the electromechanical assembly which contains the solder joints that are to be stretched can have any desired configuration. Thus, for example, the substrate 12 can be increased in size and multiple integrated circuit die can be soldered to it. Also, the substrate can be made of any desired materials. For example, the substrate can be a co-fired multi-layer ceramic substrate, or it can be a multi-layer epoxy glass substrate.

Also, in the above described methods, the integrated circuit die can be attached to the substrate by any number of solder joints; and those solder joints can be arranged in any predetermined pattern. Further, the integrated circuit die itself can, as an alternative, be replaced with any desired electrical component. For example, the die 11 can be replaced with a surface mount type of ceramic integrated circuit package.

Further, as still another variation, an additional step can be performed at the start of the above described processes wherein the electromechanical assembly is preheated to a temperature which is slightly below the melting temperature of the solder joints. Suitably, this preheating is achieved by placing the assembly on a hot plate. By this process variation, thermally induced stresses within the assembly are reduced when the solder is subsequently melted by the infrared lamp.

Likewise, as another variation, the infrared lamp can be replaced with a different heating source. For example, the heating source can be an oven in which the assembly is placed or a stream of hot gas.

Further, as yet another variation, another step can be added to the above described processes wherein the assembly is immersed in an inert gas while the solder joints are melted and stretched. Suitably, the inert gas is nitrogen. With this process variation, oxidation of the solder joints is prevented; and that is desired because some solders become more brittle if they oxidize.

Further, as still another process variation, the stepping motor stage 71 of FIG. 10 can be replaced with a manually driven stage which will precisely move the bracket 72 either in increments, or continuously. Preferably, the mechanism includes an accurate measuring instrument, such as a micrometer, to measure the amount by which the bracket 72 is moved. An example of a suitable motor driven stage 71 as well as an example of a suitable manually driven stage respectively are the model UT100-PP and the model UT100-MN from Klinger Scientific Corporation of Garden City, N.Y.

What is claimed is:

1. A method of stretching solder joints between the input/output pads of an electrical component and corresponding input/output pads on a substrate including the steps of:

melting said solder joints;

confining said component with a fixture while said solder joints are melted such that said component can only move substantially perpendicular to said substrate;

grasping said component by squeezing said component on two sides, while said component is confined, and simultaneously pulling in a direction away from said substrate to thereby stretch said melted solder joints;

stopping all movement of said component, after said component has moved a predetermined distance; and, resolidifying said solder joints while said component is stopped.

2. A method according to claim 1 wherein said fixture has an opening which exposes a substantial portion of said component, and said melting step is performed by subjecting the exposed portion of said component to infrared radiation through said fixture opening.

3. A method according to claim 1 wherein said fixture prevents lateral and rotational movement of said component by squeezing said component between two members, at least one of which is moveable and accommodates a range of component sizes.

4. A method according to claim 1 wherein each of said solder joints contains essentially the same volume of solder.

5. A method according to claim 1 wherein each of said solder joints has essentially the same melting temperature.

6. A method according to claim 1 wherein said predetermined distance is long enough to cause all of said stretched solder joints to have a concave shape.

7. A method according to claim 1 wherein said predetermined distance is long enough to cause all of said solder joints to be stretched by 25% to 150%.

8. A method according to claim 1 wherein said component is a bare integrated circuit die.

9. A method according to claim 1 wherein said component is an integrated circuit die which is enclosed within a protective integrated circuit package.

10. A method of stretching solder joints between the input/output pads of an electrical component and corresponding input/output pads on a substrate including the steps of:

melting said solder joints;

confining said component with a fixture while said solder joints are melted such that said component can only move substantially perpendicular to said substrate;

sucking said component, while said component is confined, with a vacuum in a direction away from said substrate to thereby stretch said melted solder joints;

stopping all movement of said component, after said component has moved a predetermined distance, with said fixture; and, resolidifying said solder joints while said component is stopped.

11. A method according to claim 10 wherein said fixture has an opening which exposes a substantial portion of said component, and said melting step is performed by subjecting the exposed portion of said component to infrared radiation through said fixture opening.

12. A method according to claim 10 wherein said fixture has prevents lateral and rotational movement of said component by squeezing said component between two members, at least one of which is moveable and accommodate a range of component sizes.

13. A method according to claim 10 wherein each of said solder joints contains essentially the same volume of solder.

14. A method according to claim 10 wherein each of said solder joints has essentially the same melting temperature.

15. A method according to claim 10 wherein said predetermined distance is long enough to cause all of said stretched solder joints to have a concave shape.

16. A method according to claim 10 wherein said predetermined distance is long enough to cause all of said solder joints to be stretched by 25% to 150%.

17. A method according to claim 10 wherein said component is a bare integrated circuit die.

18. A method according to claim 10 wherein said component is an integrated circuit die which is enclosed within a protective integrated circuit package.

19. A method according to claim 1 wherein said sucking and stopping steps are performed by moving said component by a predetermined number of increments with a stepping motor.

* * * * *